United States Patent [19]

Garcia, Jr. et al.

[11] Patent Number: 5,034,602
[45] Date of Patent: Jul. 23, 1991

[54] OPTICALLY ACTIVATED KEYBOARD FOR DIGITAL SYSTEM HAVING CHARACTER BACK LIGHTING

[75] Inventors: Felix Garcia, Jr., Round Rock; Rodney D. Williams, Plano, both of Tex.

[73] Assignee: Texas Instruments Incorporated, Dallas, Tex.

[21] Appl. No.: 384,183

[22] Filed: Jul. 21, 1989

[51] Int. Cl.$^5$ .................. H03K 17/94; G01D 5/34
[52] U.S. Cl. .................. 250/227.22; 250/229; 341/31; 341/23; 340/712
[58] Field of Search ........... 250/229, 221, 227, 227.22, 250/227.21; 340/711, 712; 341/31, 23, 22

[56] References Cited

U.S. PATENT DOCUMENTS

| | | | |
|---|---|---|---|
| 3,519,116 | 7/1970 | Koehn | 250/229 |
| 3,676,689 | 7/1972 | Knepper, Sr. | 250/229 |
| 3,856,127 | 12/1974 | Halfon et al. | 250/221 |
| 4,078,257 | 3/1978 | Bagley | 341/23 |
| 4,303,856 | 12/1981 | Serras-Paulet | 250/229 |
| 4,311,990 | 1/1982 | Burke | 250/221 |
| 4,387,367 | 6/1983 | Fisher | 250/221 |
| 4,441,001 | 4/1984 | Miyano et al. | 340/712 |
| 4,551,717 | 11/1985 | Dreher | 340/712 |
| 4,806,908 | 2/1989 | Krupnik | 340/712 |
| 4,836,636 | 6/1989 | Obara et al. | 250/229 |

Primary Examiner—David C. Nelms
Assistant Examiner—Michael Messinger
Attorney, Agent, or Firm—L. Joy Griebenow; James T. Comfort; Melvin Sharp

[57] ABSTRACT

An optically activated keyboard having key members, each with a key pad having illuminated symbols at the keypad surface and for contact with the finger of the operator. A plunger is secured to the key pad for operating a device to indicate which key has been depressed. In one embodiment of the present invention, the plunger is formed of light transmitting material to transmit light from the interior of the keyboard to the key pad. The key pad has a light transmissive portion with a symbol thereon which is illuminated by the light passing through the plunger to provide the desired illuminated symbol. As a second embodiment, the symbol can be disposed in the light conducting plunger or thereebeneath whereby the light entering the transparent key pad is in the shape of the desired symbol in either a negative or a positive representation thereof to project the desired symbol from the key pad. As a third embodiment, light travelling in the optically activated keyboard wave guides is partially reflected into the transparent plunger by a beam splitter in the plunger end extending into the wave guide. As a fourth embodiment, the beam splitter of the third embodiment is a portion of the plunger and extends below the wave guide to a light source. As a fifth embodiment, a slot is provided between the light source and the plunger for receipt of a removable template containing the characters corresponding to the key configuration.

25 Claims, 4 Drawing Sheets

OPTICALLY ACTIVATED KEYBOARD FOR DIGITAL SYSTEM HAVING CHARACTER BACK LIGHTING

CROSS REFERENCE TO RELATED PATENT

This invention is an improvement of the keyboard disclosed in the patent of Garcia, Jr., U.S. Pat. No. 4,641,026, the contents of which are incorporated herein in their entirety by reference.

BACKGROUND OF THE INVENTION

1. Field of the Invention

This invention relates to optically activated keyboards and, more specifically, to an optically activated keyboard having a light transmitting plunger in each key thereof to provide an indication of the function of each key.

2. Brief Description of the Prior Art

The demand for dynamic key cap labels has resulted in removable templates and other high cost solutions to obtain this result.

Optically activated keyboards of the prior art are exemplified by the above noted patent of Garcia, Jr. as well as by prior art cited therein, bulbs or LEDs behind each key, fiber optics which transmit light to each key and keyboard overlays and templates. In keyboards of these types, the key function has been provided by a symbol formed on the upper surface of the key cap.

A problem with such prior art keyboards is that it is difficult to discern the symbol on the key cap under poor lighting conditions, therefore requiring that the operator memorize the key locations for operation under such low light conditions for operation under such conditions. A further problem arises in the use of the keyboard in military Night Vision systems wherein special wavelength environments are required to provide key legend readability. It is therefore readily apparent that key caps having illuminated symbols thereon are useful and required by the art.

SUMMARY OF THE INVENTION

In accordance with the present invention, the above noted problem with the prior art is overcome and there is provided an optically activated keyboard having illuminated symbols appearing at the surface of the key caps.

Briefly, this is accomplished by providing a keyboard having plural key members, each key member having a key cap for providing an illuminated symbol thereon and for contact with the finger of the operator and a plunger secured to the key cap for operating an appropriate device to indicate which of the keys of the keyboard has been depressed. In accordance with one embodiment of the present invention, the plunger is formed of light transmitting material, such as, for example, a light conducting rod, to transmit light from the interior of the keyboard to the key cap. The key cap has a light transmissive portion with a symbol thereon which is illuminated by the light passing through the plunger to provide the desired illuminated symbol. As a second embodiment, the symbol can be disposed in the light conducting plunger or therebeneath whereby the light entering the transparent key cap is in the shape of the desired symbol in either a negative or a positive representation thereof, thereby projecting the desired symbol from the key cap. As a third embodiment, light travelling in the wave guides of the optically activated keyboard as set forth in the above identified Garcia, Jr. patent can be partially reflected into the transparent plunger by means of a beam splitter in the plunger end extending into the wave guide. As a fourth embodiment, the beam splitter of the third embodiment can be a portion of the plunger and extend below the wave guide to a light source.

DESCRIPTION OF THE PREFERRED EMBODIMENTS

Figure 1:
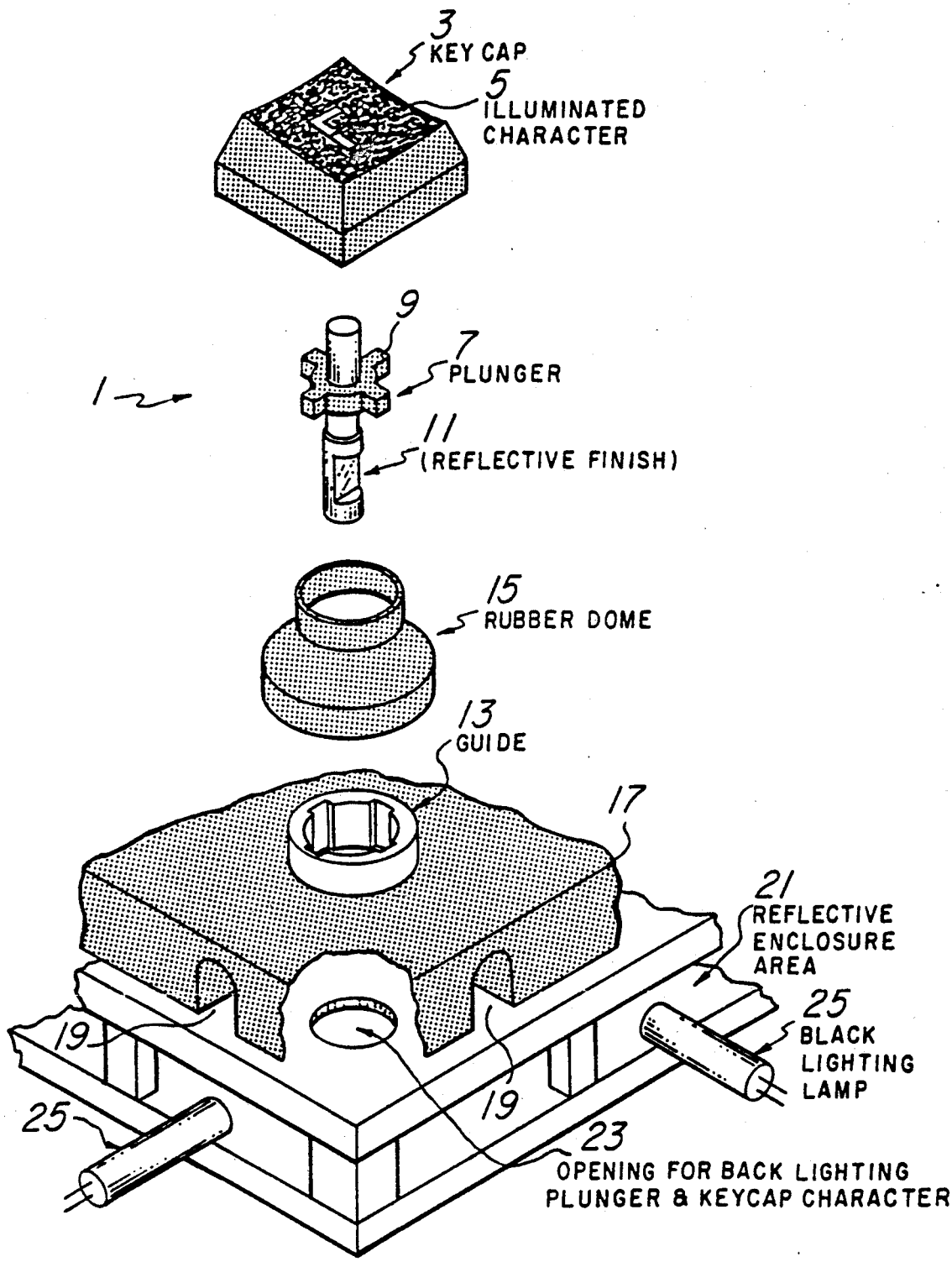
FIG. 1 is an exploded view of a key cap in accordance with a first embodiment of the present invention.

In all cases in the description provided hereinbelow, identical reference characters refer to the same or similar components or structures.

Referring first to FIG. 1, there is shown a first embodiment of a key cap in accordance with the present invention. It should be understood that a keyboard will have plural such key caps as is described in the above noted Garcia, Jr. patent and which is well known in the art. The key cap described herein is similar to the key cap of the above mentioned Garcia, Jr. patent and can be a direct replacement therefor. The key member 1 comprises a key cap 3 having a symbol 5 thereon which differs from that of the above mentioned Garcia, Jr. patent by being illuminated by light extending to the key cap surface from beneath the key cap as will be explained hereinbelow. At least the portion of the key cap 3 containing the symbol 5 is light transparent. Accordingly, the key cap 3 can be formed entirely of light transmissive material with a light opaque symbol on the surface thereof or only the portion of the key cap in the shape of the symbol can be light transmissive. A plunger 7 which differs from that of the above mentioned Garcia, Jr. patent by being formed of a light conducting material, such as, for example, a Lucite light conducting rod, is secured to the key cap 3 and provides the required light to the symbol containing portion 5 thereof. The plunger 7 includes an alignment member 9 for alignment with the guide 13 as will be discussed hereinbelow. The plunger 7 also includes a reflective surface portion 11 for reflecting light in the manner discussed for the reflective portion 33 of the above noted Garcia, Jr. patent.

The plunger 7 passes through a rubber dome 15 and guide 13 in housing 17. The guide 13 has an interior configuration to mate with the exterior configuration of the alignment member 9. The housing 17, which is integral with the guide 13, includes wave guides 19 which are the same as the wave guides 40 and 41 of the above mentioned Garcia, Jr. patent. The key member 1 further includes a reflective enclosure portion 21 having an aperture or opening 23 therein aligned with the guide 13 to permit light from the enclosure portion to travel therethrough to the plunger 7 and thence to the symbol portion 5 of the key cap 3. The enclosure portion 21 includes an illuminating device such as, for example, a back lighting lamp member 25 therein at the aperture 23. Since there is an aperture aligned with each key member of the keyboard, there can be an illuminating device at each aperture or a single illuminating device extending to plural such apertures. The illuminating device will be in an illuminating state when the keyboard is operational.

In operation, the illuminating device 25 will be on and will reflect light through the aperture 23 to the plunger 7 which extends into the guide 13. This light will pass through the plunger 7 to the key cap 3 and illuminate the symbol 5 thereon. Such illumination will take place regardless of the operation state of the key member 1, it being apparent that such key operation will cause the plunger to move into and out of the path of the wave guide as described in the above noted Garcia, Jr. patent. However, at all times, light from the illuminating device 25 will reach the symbol on the key cap 3 via the plunger 7.

Figure 2:
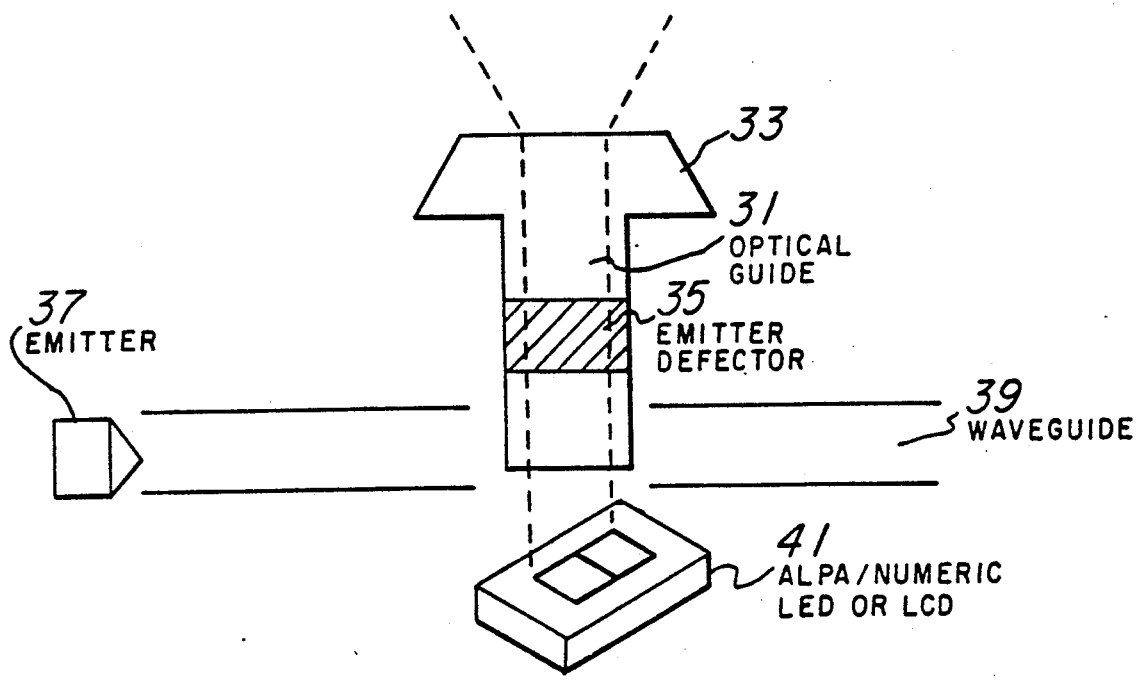
FIG. 2 is a view, partly in cross section, of a key cap in accordance with a second embodiment of the present invention.

Referring now to FIG. 2, there is shown a second embodiment of a key pad in accordance with the present invention. In accordance with this embodiment, the plunger is in the form of an optical light guide 31 and forms a part of the key cap 33. The key cap 33 also includes an emitter deflector 35 therein for deflecting light from the light emitter 37 along the waveguide 39. A symbol generating LED or LCD device 41 is disposed beneath the waveguide 39, similar to the illuminating device of the first embodiment, to project a symbol via the optical guide 31 to the surface of the key cap 33. The symbol generating device 41 can be programmable to provide any predetermined symbol capable of being formed, as is well known, to provide a changeable key cap symbol capability.

Figure 3:
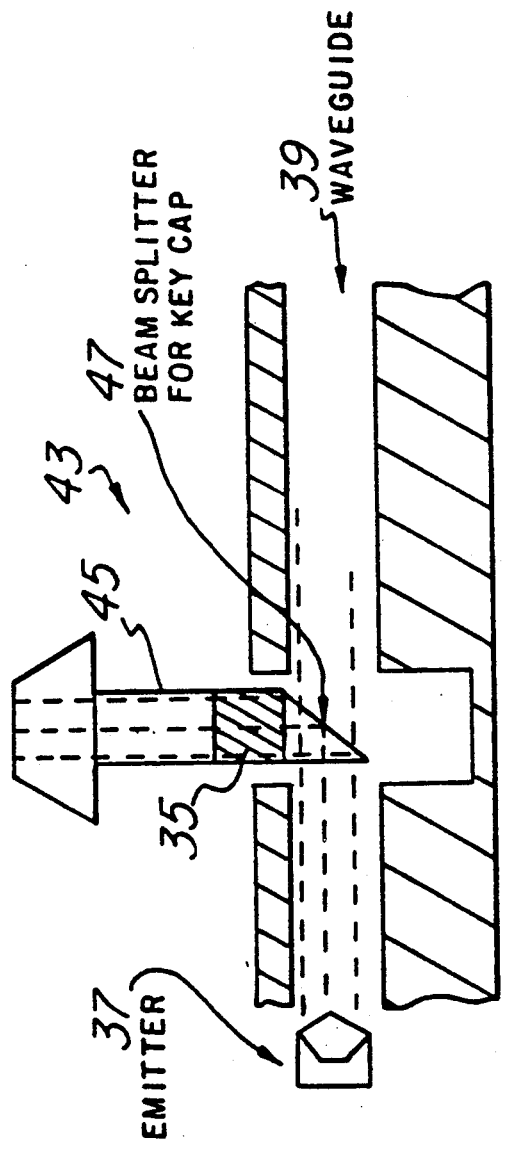
FIG. 3 is a cross sectional view in accordance with a third embodiment of the present invention.

Referring now to FIG. 3, there is shown a third embodiment in accordance with the present invention. This embodiment is similar to the second embodiment in that the key member 43 includes an integral plunger and key cap 45 with the plunger having an emitter deflector 35 and being light transmissive. However the key cap 45 includes a symbol on the surface thereof (not shown) the same as in the first embodiment and the plunger includes a beam splitter 47 normally extending into the wave guide 39. In this manner, light from light emitter 37 is normally deflected by the beam splitter 47 and along the plunger to illuminate the symbol on the key cap face as in the first embodiment. Key cap depression will provide keyboard operation as in the second embodiment.

Figure 4:
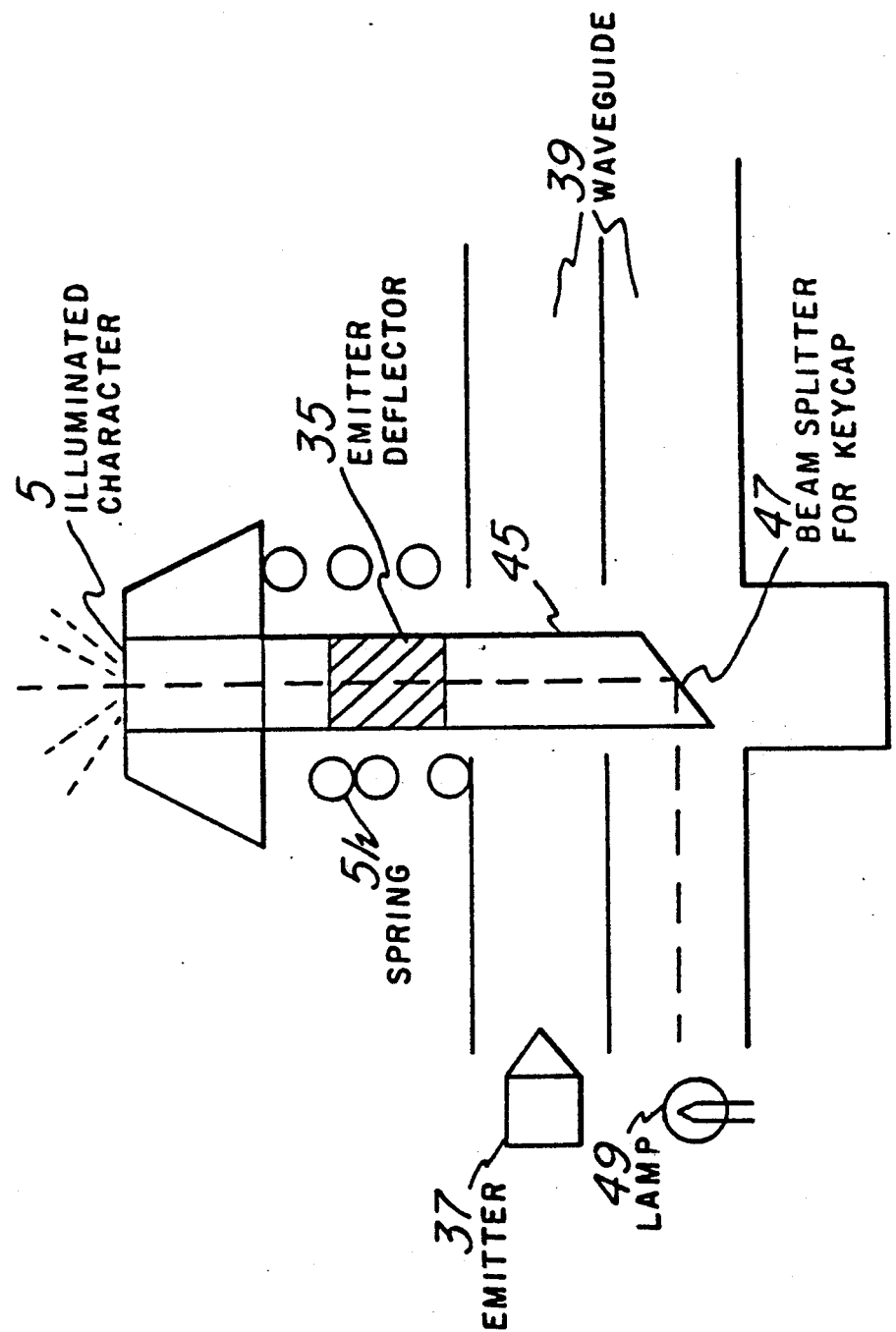
FIG. 4 is a cross sectional view in accordance with a fourth embodiment of the present invention.

Referring now to FIG. 4, there is shown a fourth embodiment in accordance with the present invention. This embodiment is similar to the third embodiment except that the light impinging upon the beam splitter 47 is generated by a lamp 49 disposed in the enclosure 21 rather than being provided by the light emitter 37. Also shown in a spring 51 to retain the key cap 45 in the normally raised position as shown. A spring of this type will be present in all of the embodiments herein as is well known. Otherwise, operation is identical to that of the third embodiment.

As a further embodiment, a slide in template is provided which slides under all of the keys of the matrix to relegend all of the keys simultaneously. This embodiment is provided, with reference to FIG. 1, by providing a slot in the top surface of the reflective enclosure area 21 for receiving a template having either light opaque characters with a light transmitting surrounding region or vice versa thereon, the characters being positioned to be aligned with the axes of the key members 1 and specifically the plunger 7 of each key member. In this way, the old template can be removed and a new template can be entered into the slot corresponding to any new key configuration, thereby permitting the entire keyboard display to be changed by a single operation. In this way, light from the lamps 25 will pass through the template to provide a light image in the shape of the sensed character, this light image being projected on the surface of the key cap 3.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A keyboard for a manual input apparatus having plural key means comprising:
   (a) plural key means, each key means including: a key cap having a light transmissive portion extending to a surface thereof;
   (b) a light transmissive plunger having an axis extending through said key cap and secured to said key cap;
   (c) a pair of intersecting wave guides disposed normal to the axis of said plunger, said plunger having a light reflective portion projectable into said wave guides at their location of intersection; and
   (d) light generating means disposed at an end portion of one of said intersecting wave guides for transmitting light along said one wave guide toward said intersection,
   (e) said plunger responsive to a predetermined condition to deflect said light along the other of said intersecting wave guides and responsive to said light from said light generating means to transmit said light to said surface of said key cap to provide a predetermined symbol representation at said surface.

2. A keyboard as set forth in claim 1 wherein said key cap includes a symbol on said surface contacting said light transmissive portion extending to said surface thereof.

3. A keyboard as set forth in claim 1 wherein said light generating means includes an enclosure having an aperture and a light generator in said enclosure extending beneath said aperture, said plunger being parallel to the axis of said aperture.

4. A keyboard as set forth in claim 2 wherein said light generating means includes an enclosure having an aperture and a light generator in said enclosure extending beneath said aperture, said plunger being parallel to the axis of said aperture.

5. A keyboard as set forth in claim 2, wherein said key cap includes a light transmissive region therein in the shape of said symbol on the surface thereof extending to said plunger, the portion of said key cap surrounding said light transmissive region being relatively opaque.

6. A keyboard as set forth in claim 4, wherein said key cap includes a light transmissive region therein in the shape of said symbol on the surface thereof extending to said plunger, the portion of said key cap surrounding said light transmissive region being relatively opaque.

7. A keyboard as set forth in claim 1, further including template receiving means disposed between said plunger and said light generating means and a template removably positioned in said template receiving means.

8. A keyboard as set forth in claim 7 wherein said template includes light transmissive and light opaque regions thereon in predetermined arrangement to project light therethrough of predetermined shape.

9. A keyboard as set forth in claim 1, wherein said light generating means comprises a symbol generator generating a light beam in a predetermined shape.

10. A keyboard as set forth in claim 9 wherein said plunger forms a part of said key cap and extends to said surface thereof.

11. A keyboard as set forth in claim 9 wherein said symbol generator is one of an LED and LCD device.

12. A keyboard as set forth in claim 10 wherein said symbol generator is one of an LED and LCD device.

13. A keyboard as set forth in claim 10 wherein said symbol generator is programmable.

14. A keyboard as set forth in claim 12 wherein said symbol generator is programmable.

15. A keyboard as set forth in claim 1, wherein said light generating means comprises a symbol generator generating a light beam in a predetermined shape.

16. A keyboard as set forth in claim 15 wherein said plunger forms a part of said key cap and extends to said surface thereof.

17. A keyboard as set forth in claim 15 wherein said symbol generator is one of an LED and LCD device.

18. A keyboard as set forth in claim 16 wherein said symbol generator is one of an LED and LCD device.

19. A keyboard as set forth in claim 16 wherein said symbol generator is programmable.

20. A keyboard as set forth in claim 18 wherein said symbol generator is programmable.

21. A keyboard as set forth in claim 1 wherein said plunger has a terminal portion, further includes a beam splitter at said terminal portion remote from said key cap for receiving light from said light generator means and deflecting said light along said other wave guide and along said plunger.

22. A keyboard as set forth in claim 21 wherein said beam splitter is disposed intermediate said key cap and said terminal portion of said plunger.

23. A keyboard as set forth in claim 21 wherein said beam splitter projects into said wave guide.

24. A keyboard as set forth in claim 21 further including a channel disposed adjacent said wave guide, said channel including said light generating means, said beam splitter normally extending into said channel.

25. A keyboard as set forth in claim 22 further including a second light source impinging light upon said terminal portion of said plunger, said plunger directing said light from said second light source to said key cap.

* * * * *